United States Patent
Kozuka

(10) Patent No.: US 6,608,299 B2
(45) Date of Patent: Aug. 19, 2003

(54) PHOTOELECTRIC CONVERSION APPARATUS, DRIVING METHOD THEREOF, AND INFORMATION PROCESSING APPARATUS

(75) Inventor: Hiraku Kozuka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 78 days.

(21) Appl. No.: 09/988,874

(22) Filed: Nov. 21, 2001

(65) Prior Publication Data

US 2002/0063199 A1 May 30, 2002

(30) Foreign Application Priority Data

Nov. 28, 2000 (JP) .................................. 2000-361677
Nov. 28, 2000 (JP) .................................. 2000-361678
Nov. 14, 2001 (JP) .................................. 2001-348894

(51) Int. Cl.[7] .............................................. H01L 31/00
(52) U.S. Cl. ..................... 250/214.1; 257/448; 257/461
(58) Field of Search .................... 250/214.1, 214 R; 257/448, 461, 465

(56) References Cited

U.S. PATENT DOCUMENTS

| | | | | |
|---|---|---|---|---|
| 3,870,887 A | * | 3/1975 | Dueker et al. | 250/370.1 |
| 5,844,234 A | * | 12/1998 | Kawazoe | 250/208.1 |
| 5,920,092 A | * | 7/1999 | Watanabe | 257/292 |
| 5,969,337 A | * | 10/1999 | Yiannoulos | 250/214.1 |
| 6,087,703 A | * | 7/2000 | Ohta et al. | 257/461 |
| 2002/0017661 A1 | * | 2/2002 | Shinohara | 257/238 |
| 2003/0020003 A1 | * | 1/2003 | Berezin | 250/214.1 |

FOREIGN PATENT DOCUMENTS

| | | | |
|---|---|---|---|
| EP | 1 032 049 A2 | 8/2000 | |
| JP | 4-123473 | * 4/1992 | 257/461 |

* cited by examiner

Primary Examiner—Stephone B. Allen
Assistant Examiner—Eric J Spears
(74) Attorney, Agent, or Firm—Fitzpatrick, Cella, Harper & Scinto

(57) ABSTRACT

A photoelectric conversion apparatus is comprised of a light-receiving element having a first semiconductor region of a first conduction type, and a second semiconductor region of a second conduction type for storing a charge generated by photoelectric conversion adjacent to the first semiconductor region, a readout electrode for reading a signal based on the charge stored in the second semiconductor region; and at least a pair of electrode portions spaced from each other along a photoreceptive surface so as to place a photoreceptive portion of the second semiconductor region in between, and connected to the first semiconductor region. Applied to the pair of electrode portions is a voltage that completely depletes the photoreceptive portion of the second semiconductor region and that can create a potential gradient for moving the charge stored in the second semiconductor region, to the readout electrode side.

17 Claims, 13 Drawing Sheets

PHOTOELECTRIC CONVERSION APPARATUS, DRIVING METHOD THEREOF, AND INFORMATION PROCESSING APPARATUS

BACKGROUND OF THE INVENTION

1. Field of the Invention

The present invention relates to information processing apparatus such as image scanners, facsimile machines, copying machines, image sensing apparatus of radiographic image, and so on, photoelectric conversion apparatus used therein, and a driving method thereof.

2. Related Background Art

In the field of linear photoelectric conversion apparatus, active development is recently under way to develop CCD image sensors employing a reduction optical system, and 1:1 type contact image sensors in which a plurality of semiconductor photosensor chips are multiply mounted in a line or in a zigzag pattern. It is common practice to use photodiodes consisting of pn junctions of semiconductors, as light-receiving elements of these photoelectric conversion apparatus.

In the case of amplification type photoelectric conversion apparatus wherein each pn junction part stores a charge obtained by photoelectric conversion, i.e., photo-generated carriers generated by received light and wherein a signal voltage is read out by means of a charge-voltage converter, in order to realize high sensitivity, it is necessary to store the photo-generated carriers effectively and decrease the capacitance of the photoelectric conversion part storing carriers to a value as small as possible.

In the contact image sensors using the light-receiving elements of photodiodes obtained by forming in a semiconductor substrate of a first conduction type areas of an opposite conduction type, however, for example, where the resolution is 300 dpi, the pixel pitch becomes about 84.7 $\mu$m, and, in order to extract the photocarriers effectively, it is preferable to form each pn junction in an area approximately equal to that of an aperture portion. However, this results in increasing the capacitance of the pn junction in each photodiode part.

On the other hand, if the area of the pn junction is made smaller in order to decrease the capacitance of the pn junction in the photodiode part, a depletion layer region formed by the pn junction becomes too small relative to the aperture, so as to fail to increase carriers stored in the pn junction part.

In order to solve the above problem, the inventors of the present application proposed the light-receiving element that can have a large light-receiving area while having a small junction capacity, for example, in the specification of European Patent Application Laid-Open No. 1032049.

FIG. 18A is a plan view of a light-receiving element part of the photoelectric conversion apparatus as described in foregoing Application. FIG. 18B is a cross-sectional structure view along a line 18B—18B of FIG. 18A. FIG. 18C is a diagram showing a potential profile in a direction along the line 18B—18B of FIG. 18A. FIG. 18D is a diagram showing a potential profile in a direction along a line 18D—18D of FIG. 18B.

In FIGS. 18A to 18D, reference numeral 1 designates an electrode region, 2 a photoreceptive surface, 3 a p-type semiconductor substrate, 4 an n-type semiconductor region, and 5 a p-type semiconductor region, and the structure is such that light is incident through the photoreceptive surface 2 into a photodiode region having the p-type semiconductor substrate 3, n-type semiconductor region 4, and p-type semiconductor region 5. The electrode region 1 is an n-type high-concentration impurity region and electrode region to which carriers (electrons herein) generated in the photodiode region are gathered to be transferred.

As shown in FIG. 18B, since the conventional photoelectric conversion apparatus is constructed in the structure wherein the p-type semiconductor region 5 of a relatively high concentration is formed on the surface of the p-type semiconductor substrate 3 and wherein the n-type semiconductor region 4 is vertically sandwiched between the surface p-type semiconductor region 5 and the p-type semiconductor substrate 3, the n-type semiconductor region 4 has depletion layers on the both sides, i.e., on the p-type semiconductor region 5 side and on the p-type semiconductor substrate 3 side, thus forming the potential structure as shown in FIG. 18D.

As a result, electrons out of generated electron-hole pairs are gathered in a channel of this potential structure and finally collected into the electrode region 1 with the lowest potential relative to the stored carriers.

However, the prior art sometimes suffers a strong afterimage due to transmission characteristics of photocarriers generated in the light-receiving element. The reason for it is as follows. The carriers generated in the depleted regions in the depth direction diffuse to reach the electrode region with the lowest potential, but rates of the diffusion vary depending upon the potential profile in the depth direction. For this reason, if the potential profile is one that makes the diffusion rates slow, there will appear an afterimage in a next field because of carriers failing to reach the electrode region in certain cases.

Particularly, where the light-receiving element has the photoreceptive surface of a relatively large area, e.g., 30 $\mu$m×30 $\mu$m square, or greater than the area equivalent thereto, like the light-receiving elements for the contact image sensors, there can appear an afterimage in a next field because of the carriers failing to reach the electrode region in a period from an end of storage to readout.

The structure in which the flat region with the different potential is provided around the electrode region is disclosed, for example, in European Patent Application Laid-Open No. 1032049, and it improved the afterimage characteristics. However, there are still desires for completely removing the afterimage and for decreasing the afterimage without increase in the number of masks in photolithography.

SUMMARY OF THE INVENTION

It is thus an object of the present invention to improve the afterimage characteristics of the light-receiving elements in the photoelectric conversion apparatus.

It is another object of the present invention to improve the afterimage characteristics of the light-receiving elements in the photoelectric conversion apparatus without increase in the number of masks.

It is still another object of the present invention to reduce power consumption in the photoelectric conversion apparatus with excellent afterimage characteristics.

An aspect of the present invention is a photoelectric conversion apparatus comprising:

a light-receiving element having a first semiconductor region of a first conduction type, and a second semiconductor region of a second conduction type for storing a charge generated by photoelectric conversion adjacent to said first semiconductor region;

a readout electrode for reading a signal based on the charge stored in said second semiconductor region; and at least a pair of electrode portions spaced from each other along a photoreceptive surface so as to place a photoreceptive portion of said second semiconductor region in between, and connected to said first semiconductor region, wherein a voltage that completely depletes the photoreceptive portion of said second semiconductor region and that can create a potential gradient for moving the charge stored in said second semiconductor region, to the said readout electrode side, is applied to the pair of electrode portions.

It is desirable herein that said first semiconductor region have a semiconductor layer formed so as to be placed between said second semiconductor region and an insulating layer placed above said second semiconductor region and that each of said pair of electrode portions be in contact with said semiconductor layer.

It is also desirable that said semiconductor layer cover the photoreceptive surface of said second semiconductor region.

It is desirable that said second semiconductor region located below said semiconductor layer be completely depleted by depletion layers extending from pn junctions on the upper and lower sides of the second semiconductor region.

It is desirable that said pair of electrode portions be shielded by a shield layer.

It is desirable that an electrode portion placed on the said readout electrode side out of said pair of electrode portions be placed in such a split form as to sandwich said readout electrode along the photoreceptive surface.

It is desirable that said readout electrode be a transfer gate electrode for transferring a charge to a floating diffusion region.

It is desirable that said readout electrode be an anode electrode or a cathode electrode connected to a gate of an amplifying transistor.

It is desirable that immediately before or during a transfer operation to transfer the charge stored in said second semiconductor region or a readout operation to read the signal based on said charge, the voltage that can create said potential gradient be applied during a predetermined period.

It is desirable that during most of an operation period of said photoelectric conversion apparatus, said pair of electrode portions be retained each at an equal potential.

It is desirable that the voltage applied to said first semiconductor region be a reverse bias voltage to said second semiconductor region.

Another aspect of the present invention is a photoelectric conversion apparatus comprising:

a light-receiving element having a first semiconductor region of a first conduction type, and a second semiconductor region of a second conduction type for storing a charge generated by photoelectric conversion adjacent to said first semiconductor region;

a readout electrode for reading a signal based on the charge stored in said second semiconductor region;

at least a pair of electrode portions spaced from each other along a photoreceptive surface so as to place a photoreceptive portion of said second semiconductor region in between, and connected to said first semiconductor region; and a circuit for retaining said pair of electrode portions at an equal potential during a first period and for applying to said pair of electrode portions a voltage that can create a potential gradient for moving the charge stored in said second semiconductor region, to the said readout electrode side, during a second period.

It is desirable herein that said second period be a period immediately before or during a transfer operation to transfer the charge stored in said second semiconductor region or a readout operation to read the signal based on said charge, through said reading electrode.

It is further desirable that said first period be longer than said second period.

Still another aspect of the present invention is a method of driving a photoelectric conversion apparatus comprising a light-receiving element having a first semiconductor region of a first conduction type, and a second semiconductor region of a second conduction type for storing a charge generated by photoelectric conversion adjacent to said first semiconductor region, and a readout electrode for reading a signal based on the charge stored in said second semiconductor region, said method comprising:

a step of retaining at least a pair of electrode portions spaced from each other along a photoreceptive surface so as to place a photoreceptive portion of said second semiconductor region in between, and connected to said first semiconductor region, at an equal potential during a first period; and a step of applying to said pair of electrode portions a voltage that can create a potential gradient for moving the charge stored in said second semiconductor region, to the said readout electrode side, during a second period.

In addition, another aspect of the present invention is an information processing apparatus comprising:

the photoelectric conversion apparatus as set forth;

a driving circuit for driving said photoelectric conversion apparatus; and a signal processing circuit for processing a signal outputted from said photoelectric conversion apparatus.

The foregoing information processing apparatus may be a radiographic image sensing apparatus having a converter for converting a radiographic image into a visible light image.

DETAILED DESCRIPTION OF THE PREFERRED EMBODIMENTS

Embodiments of the present invention will be described below with reference to the drawings.
(Embodiment 1)

FIGS. 1 to 4 are drawings for explaining a photoelectric conversion apparatus according to an embodiment of the present invention.

Figure 1:
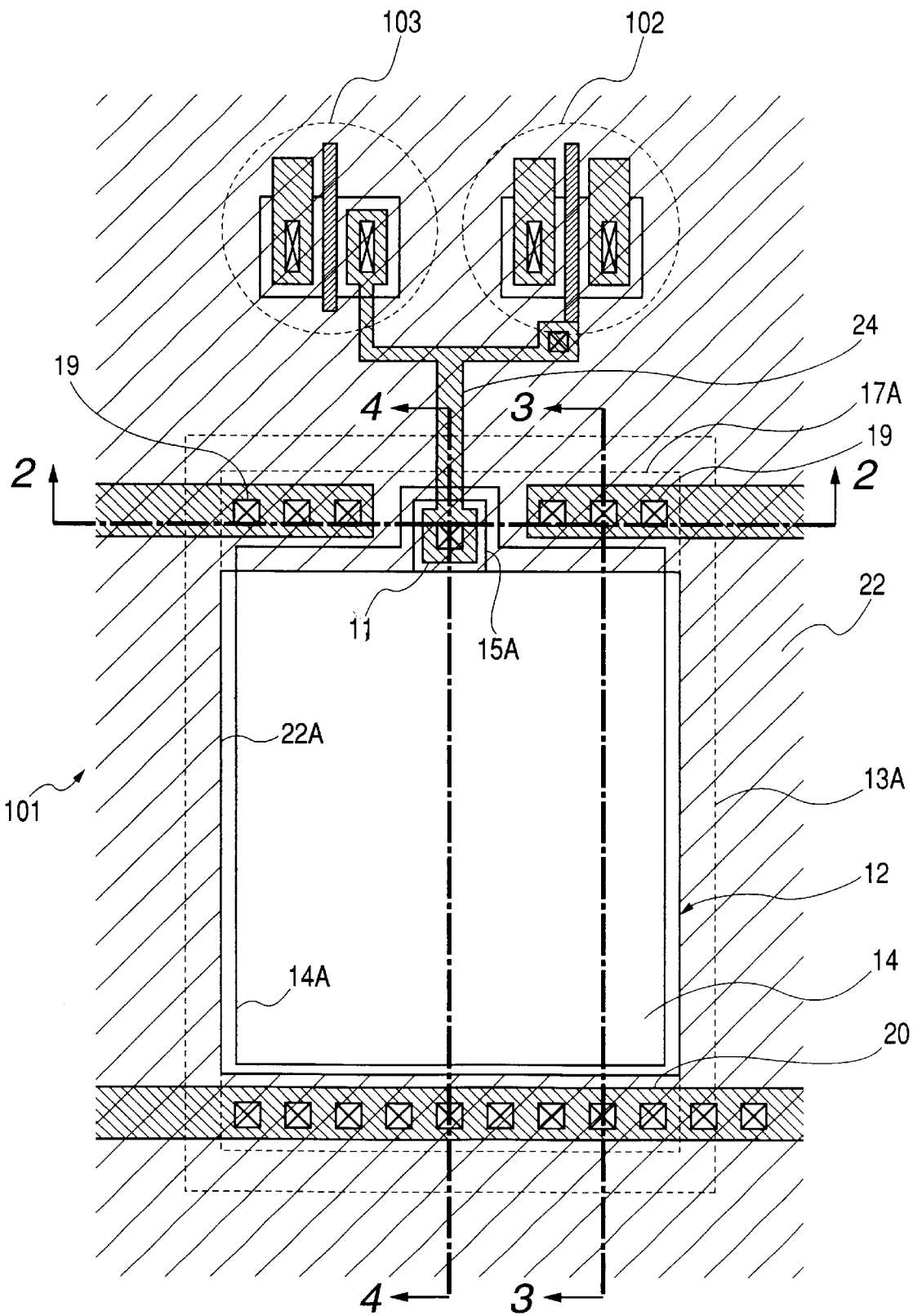
FIG. 1 is a schematic top plan view of a photoelectric conversion apparatus according to an embodiment of the present invention.

As shown in FIG. 1, the light-receiving element 101 according to the present embodiment is constructed in such structure that a p-type region 14 serving as an anode of a photodiode is formed in an aperture portion 12 and that a p$^+$ type region 11 is formed in the p-type region 14. A wire 24 comprised of an electroconductive layer of aluminum or the like electrically connects the p$^+$ type region 11 to a drain of reset MOS transistor 103 for resetting the potential of the light-receiving element 101 and to a gate of source follower MOS transistor 102 for converting a signal charge to a voltage signal. The size of aperture portion 12 is defined by side edges 22A of an aperture in a light shield layer 22 which is comprised of an electroconductive layer of aluminum or the like and which is fixed at a desired potential.

Here the p$^+$ type region 11 is disposed on the side where the drain of reset MOS transistor 103 and the source follower MOS transistor 102 are located, as shifted from the center of the aperture portion 12. A first power line 20, which is an electrode portion for supplying a first voltage to n-type well region 13, is located on the opposite side to the side where the p+type region 11 of the aperture portion 12 is located. Reference symbol 13A designates edges of the n-type well region 13, 14A edges of the p-type region 14, and 15A inner side edges of surface region 15 described hereinafter. Reference symbol 17A denotes inner side edges of field insulating film 17 and, in other words, indicates edges of an active region in which the element is formed. Numeral 18 represents an insulating film of silicon oxide or the like.

Further, a second power line 19, which is an electrode portion for supplying a second voltage to the n-type well region 13, is disposed on the left and right sides in FIG. 1 of the p$^+$ type region 11, and the p$^+$ type region 11 and second power line 19 both are formed through an interlayer insulating film below the shield layer 22. The size of the aperture portion 12 is, for example, 40 μm×60 μm.

Figure 2:
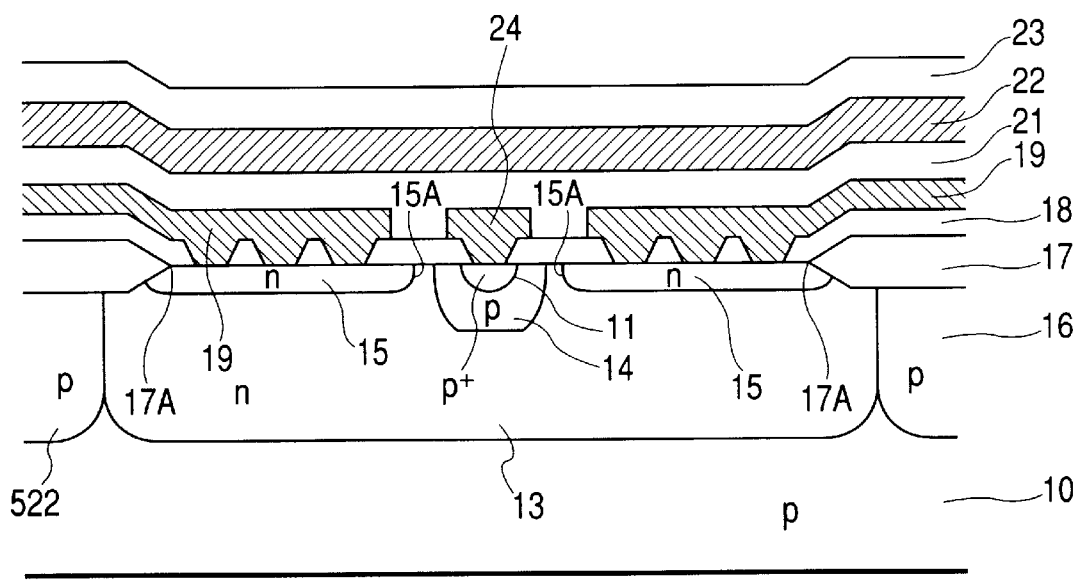
FIG. 2 is a cross-sectional view along a line 2—2 of FIG. 1.
Figure 3:
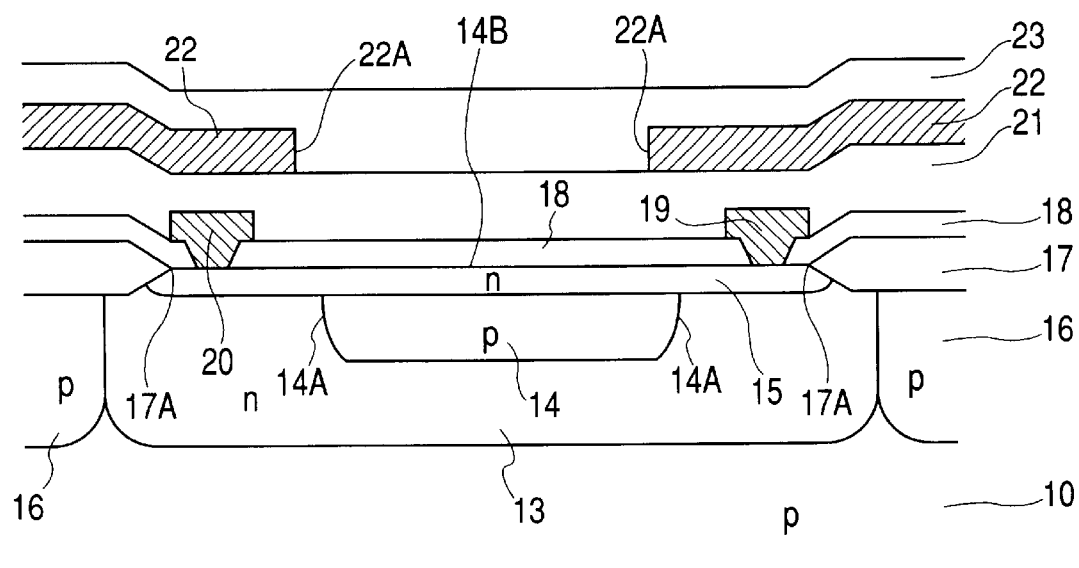
FIG. 3 is a cross-sectional view along a line 3—3 of FIG. 1.
Figure 4:
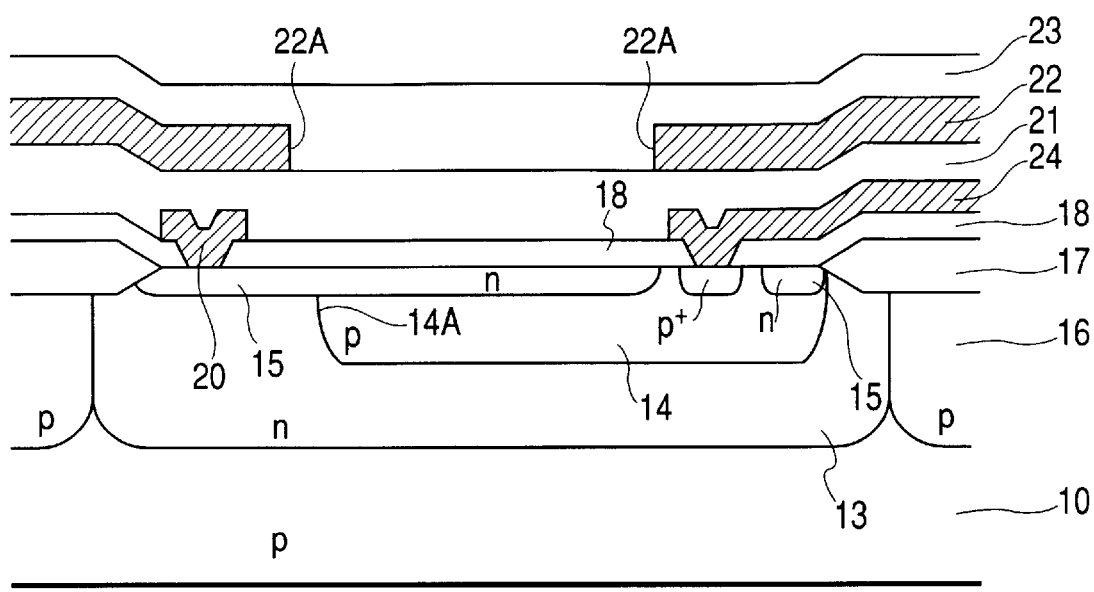
FIG. 4 is a cross-sectional view along a line 4—4 of FIG. 1.

As shown in FIGS. 2, 3, and 4, the n-type well region 13 and others are formed on a p-type semiconductor substrate 10, the p-type region 14 is placed in the n-type well region 13, and the p$^+$ type region 11 is disposed in an island shape in the p-type region 14.

The surface region 15 consisting of an n-type semiconductor layer is provided on the photoreceptive surface 14B of the p-type region 14 and is electrically connected to the n-type well region 13. Further, the n-type surface region 15 and n-type well region 13 are electrically connected to the first power line 20 and to the second power line 19.

A photovoltaic junction of the photodiode is comprised of an upper pn junction formed by the p-type region 14 and the n-type well region 13 and a lower pn junction formed by the p-type region 14 and the n-type surface region 15, and holes out of photocarriers made by photoelectric conversion in the photodiode are collected into the p$^+$ type region 11 to alter the potential of the wire 24.

Figure 5:
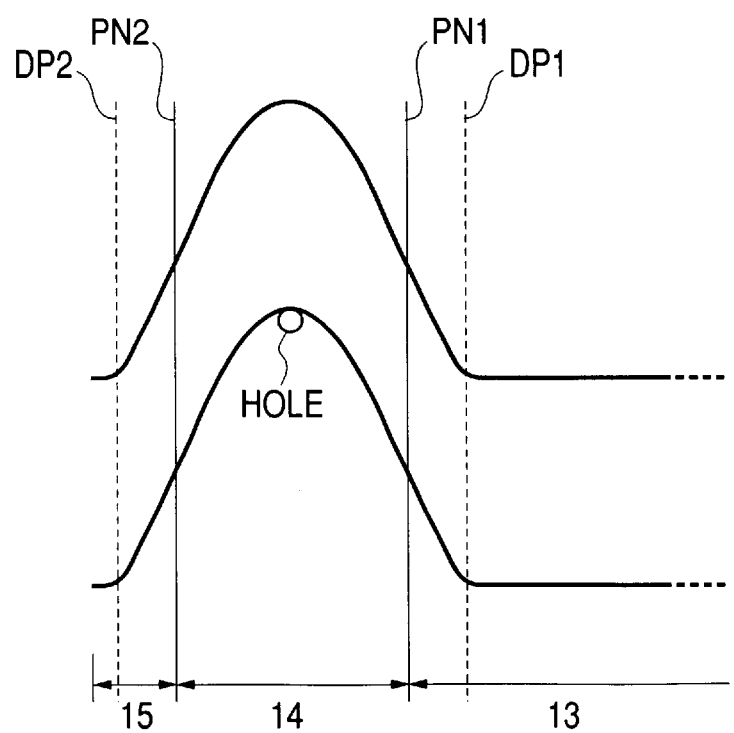
FIG. 5 is a diagram showing potential profiles in the thickness direction of the photoreceptive part of the photoelectric conversion apparatus according to an embodiment of the present invention.

FIG. 5 shows potential profiles in the thickness direction of the photoreceptive portion. The p-type region 14 is in a state without a neutral region, i.e., in a completely depleted state because of superposition of a depletion layer extending from the lower metallurgical pn junction PN1 and a depletion layer extending from the upper metallurgical pn junction PN2. DP1 and DP2 represent edges of the respective depletion layers (space charge regions). This potential structure causes the holes generated by photoelectric conversion to migrate quickly into the potential channel and then migrate immediately to the p$^+$ type region 11 because of a lateral potential gradient described hereinafter.

Further, the p$^+$ type region 11 is electrically connected in ohmic contact with the wire 24, and a protective film 23 of silicon nitride or the like and an insulating film 21 of silicon oxide or the like are provided on the upper and lower sides, respectively, of the shield layer 22. The circumference of the n-type well region 13 is surrounded by a p-type well region 16 constituting an element isolation region and the region 13 is electrically isolated at every pixel.

Listed below are approximate impurity surface concentrations/junction depths of the respective regions shown in FIGS. 2, 3, and 4.

p-type substrate 10: ca. $1\times10^{15}$ cm$^{-3}$
n-type well region 13: ca. $1\times10^{17}$ cm$^{-3}$/ca. 4.0 μm
p-type region 14: ca. $2\times10^{17}$ cm$^{-3}$/ca. 0.35 μm
n-type surface region 15: ca. $3\times10^{18}$ cm$^{-3}$/ca. 0.20 μm
p$^+$ type region 11: ca. $3\times10^{19}$ cm$^{-3}$ In the present embodiment, the complete depletion voltage of the p-type region 14 is approximately −1.0 V.

Figure 6A:
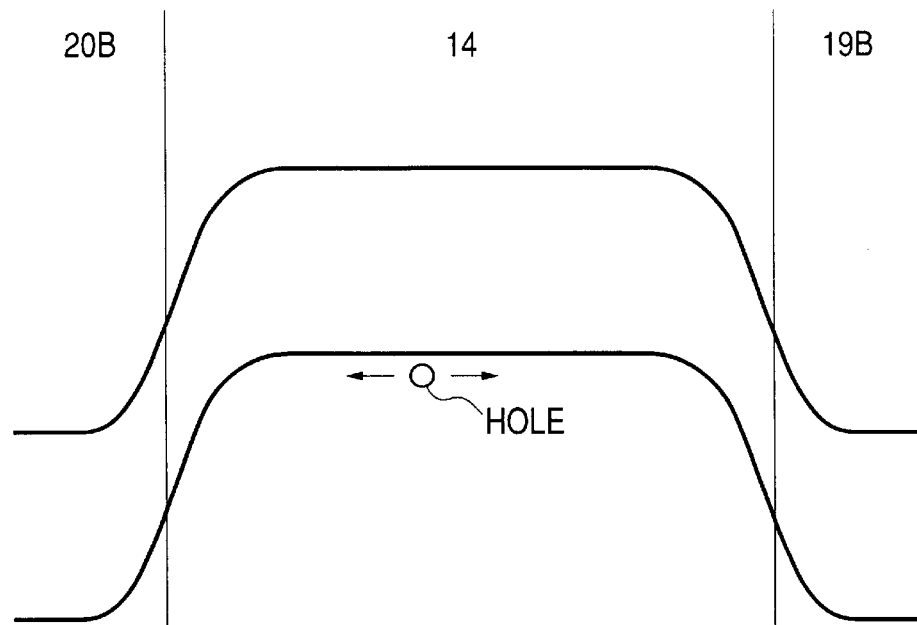
FIGS. 6A and 6B are diagrams showing potential profiles in the direction along the photoreceptive surface of the photoreceptive part of the photoelectric conversion apparatus according to an embodiment of the present invention.
Figure 6B:
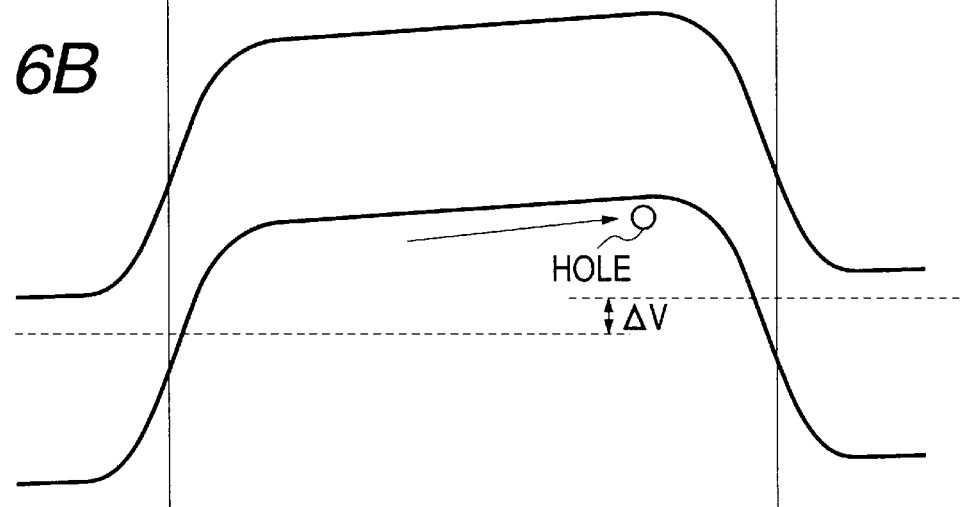

FIGS. 6A and 6B show potential profiles in the direction along the photoreceptive surface in the completely depleted photoreceptive portion and is a drawing for explaining a state in which a potential gradient is formed between the n-type region 20B on the first power line 20 side and the n-type region 19B on the second power line 19 side.

As shown in FIG. 6A, when the first power line 20 and the second power line 19 are at an equal potential, the p-type region 14 except for the vicinity of the p$^+$ type region 11, i.e., the photoreceptive part of the p-type region has a substantially uniform potential distribution in plane, so that holes out of the photocarriers generated in the p-type region 14 are collected into the p$^+$ type region 11 by only diffusion. Therefore, the afterimage characteristics become worse.

On the other hand, for example, if the potential of the second power line 19 is made lower (by ΔV) than the potential of the first power line 20 as shown in FIG. 6B, a potential gradient is formed in a direction from the first power line 20 toward the second power line 19, so that holes out of the generated photocarriers preferentially migrate to the p$^+$ type region 11, which makes it hard for residual holes to remain. As a result, the afterimage characteristics are drastically improved.

A large-area and low-capacitance light-receiving element 101 can be implemented by selecting as the voltages applied to the first and second power lines 20, 19 voltages to reverse bias the n-type well region 13 and the n-type surface region 15 relative to the p-type region 14 and setting values of such voltages so as to completely deplete the photoreceptive part of the p-type region 14 as described above in a state in which the voltages are applied.

In the present embodiment, since the p$^+$ type region 11 is formed below the shield part of the shield layer 22, photocarriers are prevented from being generated near the p$^+$ type region 11, thereby improving the afterimage characteristics not only by the aforementioned drift effect but also by the diffusion effect.

Further, since the n-type well region 13 is formed in the p-type substrate 10 and is surrounded by the p-type well region 16 at every pixel, it is feasible to almost completely suppress crosstalk caused by mixture of photocarriers into adjacent pixels and thus yield resolved patterns with high quality.

Even if photocarriers are stored over a saturation amount at a certain pixel, excess photocarriers will be absorbed by the surrounding p-type well region 16 or substrate 10 and thus cause no effect on the other pixels, so as to be able to yield a high-quality image with little blur.

In addition, it becomes feasible to increase the impedance between the first power line 20 and the second power line 19 and thus reduce current drain.

As detailed above, the photoelectric conversion apparatus of the present embodiment is comprised of the light-receiving element 101 having the first semiconductor region 13, 15 of the first conduction type, and the second semiconductor region 11, 14 of the second conduction type adjacent to the first semiconductor region 13, 15, for storing a charge obtained by photoelectric conversion; the readout electrode 24 for reading the signal based on the charge stored in the second semiconductor region 11, 14; and at least a pair of electrode portions 19, 20 spaced from each other along the photoreceptive surface 14B so as to place the photoreceptive part of the second semiconductor region 11, 14 in between, and connected to the first semiconductor region 13, 15.

Then applied between electrode portions 19, 20 is the voltage ΔV that completely depletes the photoreceptive part of the second semiconductor region 11, 14 (FIG. 5) and that can create the potential gradient (FIG. 6B) for moving the charge (holes) stored in the second semiconductor region 11, 14 to the readout electrode side 19B.

In this way, the photoelectric conversion apparatus of the present embodiment can be improved in the afterimage characteristics of the light-receiving element.

Figure 7:
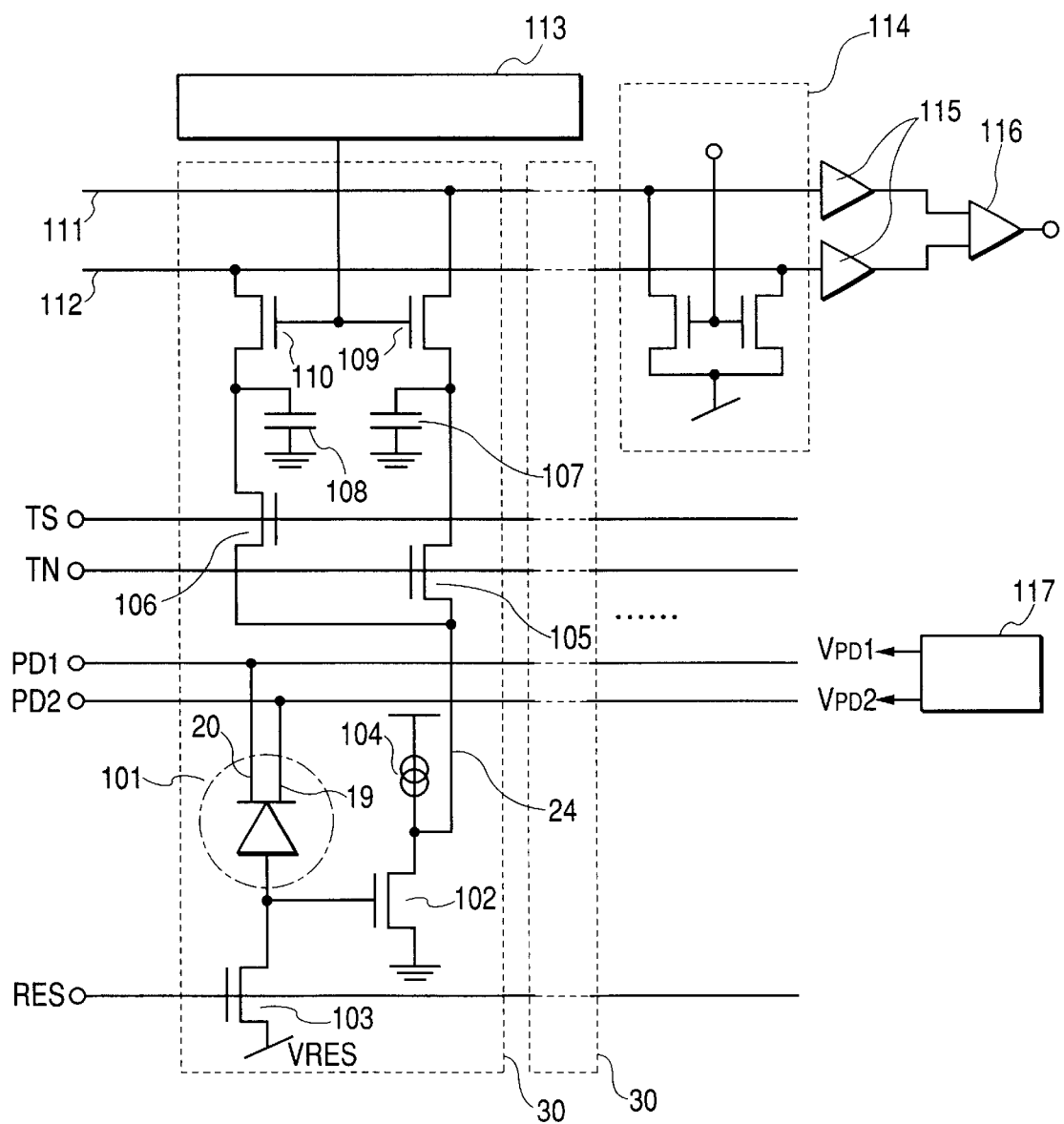
FIG. 7 is a circuit configuration diagram of the photoelectric conversion apparatus according to an embodiment of the present invention.

FIG. 7 shows a circuit configuration of the photoelectric conversion apparatus of the present invention. This figure shows a portion associated with one pixel 30. In this FIG. 7, the light-receiving element 101 is illustrated so that the cathode of the photodiode 101 being the light-receiving element has two electrodes so as to correspond to the first power line 20 and the second power line 19 just for convenience' sake.

As shown in FIG. 7, the configuration of one pixel 30 in the photoelectric conversion apparatus of the present embodiment is provided with a noise signal retention capacitor 107 for retaining a signal based on a noise signal charge immediately after reset, an MOS switch 105 for transferring the signal based on the noise signal charge to the noise signal retention capacitor 107, a light signal retention capacitor 108 for retaining a signal based on a light signal charge after storage of a light signal, and an MOS switch 106 for transferring the signal based on the light signal charge.

Further, the photoelectric conversion apparatus of the present embodiment is provided with a shift register (transferring means) 113 for sequentially transferring the signals retained respectively in the noise signal retention capacitor 107 and in the light signal retention capacitor 108 to a noise signal common output line 111 and to a light signal common output line 112; two buffer amplifiers 115 for impedance transformation of voltages of the noise signal common output line 111 and the light signal common output line 112; a differential amplifier 116 for making a difference between the voltage of the noise signal common output line 111 and the voltage of the light signal common output line 112 and amplifying the difference; and a common output line reset unit 114 for resetting the noise signal common output line 111 and the light signal common output line 112 after every transfer of one pixel. In the present embodiment the linear photoelectric conversion apparatus is constructed in such structure that 344 pixels in the configuration as shown in FIG. 7 are arranged in a line.

TS represents a gate control line (control terminal) through which pulses for controlling the MOS switch 106 are supplied; TN a gate control line (control terminal) through which pulses for controlling the MOS switch 105 are supplied; VPD1 a power line (power terminal) for applying a voltage to the electrode part 20; VPD2 a power line (power terminal) for applying a voltage to the electrode part 19; RES a reset gate control line (control terminal) through which pulses for controlling a reset MOS switch 103 are supplied. Numeral 117 indicates a voltage applying circuit for applying desired voltages to the power lines (power terminals) PD1, PD2, which may be monolithically integrated with the light-receiving elements on the same chip or may be disposed on a separate chip from that of the light-receiving elements.

(Driving Method 1 of the Photoelectric Conversion Apparatus)

Figure 8:
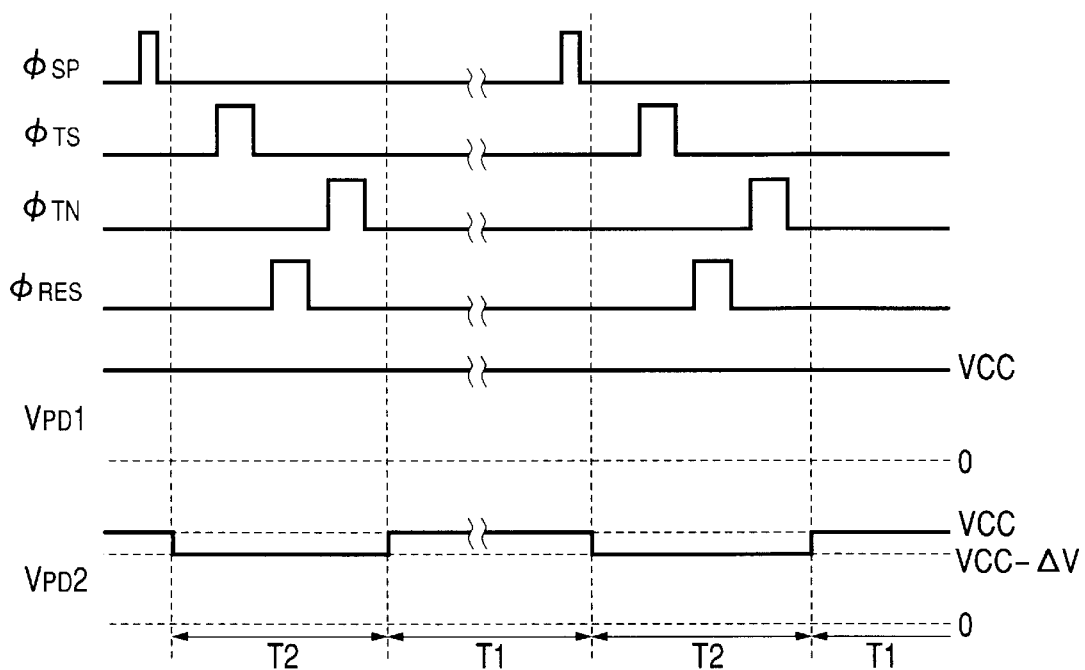
FIG. 8 is a timing chart for explaining an embodiment of the driving method of the photoelectric conversion apparatus according to the present invention.

FIG. 8 is a timing chart for driving of the photoelectric conversion apparatus of FIG. 7. First, when a start pulse φSP of the high level is fed after completion of desired storage in the light-receiving element 101, a pulse signal φTS supplied to the control line TS turns to the high level to be applied to the gate of the MOS switch 106 to turn the MOS switch 106 on, whereupon a signal based on a light signal charge of the light-receiving element 101, after converted to a voltage in the MOS source follower transistor 102, is transferred to the light signal retention capacitor 108 and retained therein.

After that, when a reset pulse signal φRES supplied to the reset control line RES turns to the high level, it is applied to the gate of the reset MOS 103 to turn the reset MOS 103 on to initiate the reset operation of the light-receiving element 101. Then a pulse signal φTN supplied to the control line TN turns to the high level and is applied to the gate of the MOS switch 105 to turn the MOS switch 105 on, whereupon a signal based on a noise signal charge immediately after reset of the light-receiving element 101, after converted to a voltage in the MOS source follower transistor 102, is transferred to the noise signal retention capacitor 107 and retained therein.

The above operation is simultaneously carried out at all the pixels and thereafter the shift register 113 is activated to sequentially transfer the signals based on the noise signal charges retained in the respective noise signal retention capacitors 107 and the signals based on the light signal charges retained in the respective light signal retention-capacitors 108 through the noise signal common output line 111 and through the light signal common output line 112. During this period, storage of light signal is further carried out in each light-receiving element 101.

Regardless of presence or absence of input of the start pulse SP of the high level, a power-supply voltage VCC is applied through the power line PD1 to the first electrode part 20 in the light-receiving element 101 to fix it at a predetermined potential. The power-supply voltage VCC is applied through the power line PD2 to the second electrode part 19 during each principal period T1 in which a charge is stored in the light-receiving element 101. During each period T2 including a transfer operation period for transfer of a signal from the light-receiving element 101, except for the periods T1, the voltage (VCC−ΔV) is applied through the power line PD2 to the second electrode part 19, so that the potential of the second electrode part 19 is lower by ΔV than that of the first electrode part 20.

Accordingly, photocarriers in the light-receiving element 101 do not reach the anode electrode side of the light-receiving element 101 in the period T1, as shown in FIG. 6A, whereas in the period T2, as shown in FIG. 6B, the potential gradient is established in the direction along the photoreceptive surface toward the anode electrode side of the light-receiving element 101 and thus the photocarriers in the light-receiving element 101 can reach the anode electrode side. After that, the apparatus performs the readout operation of transferring the signal based on the light signal charge of the light-receiving element 101 to the light signal retention capacitor 108 side in this state. Therefore, the apparatus can be drastically improved in the afterimage characteristics.

During each period T2, a current ΔV/R, which is determined by the resistance component R of the n-type well region 13 and n-type surface region 15 and the value of the potential difference ΔV between the electrode parts 20, 19, flows between the first electrode part 20 and the second electrode part 19, but the time of flow of this current can be reduced by changing the voltage applied to one electrode part between VCC and VCC−ΔV, as shown in FIG. 8.

Since most of the operation period (T1+T2) of the photoelectric conversion apparatus is the period T1 without the potential difference ΔV in this way, the current drain can be reduced as compared with a case wherein the potential difference ΔV is maintained between the pair of electrode parts during the operation period.

The afterimage characteristics were compared between the present embodiment and a comparative example (in which VCC was kept applied to each of the pair of electrodes 19, 20) under the conditions of VCC=5 V, ΔV=100 mV, and the reset voltage of the light-receiving element VRES=1 V. It was verified from the comparison that the afterimage in the present embodiment was about 1/50 and thus the present embodiment was able to improve the afterimage characteristics further. In this case, the complete depletion voltage of the light-receiving element 101 was about 1 V and the reverse bias of about 4 V was applied to the light-receiving element 101 after reset. Since the sufficiently large bias was applied relative to the depletion voltage 1 V, the present embodiment demonstrated the sensitivity equivalent to that of the comparative example.

(Driving Method 2 of the Photoelectric Conversion Apparatus)

Figure 9:
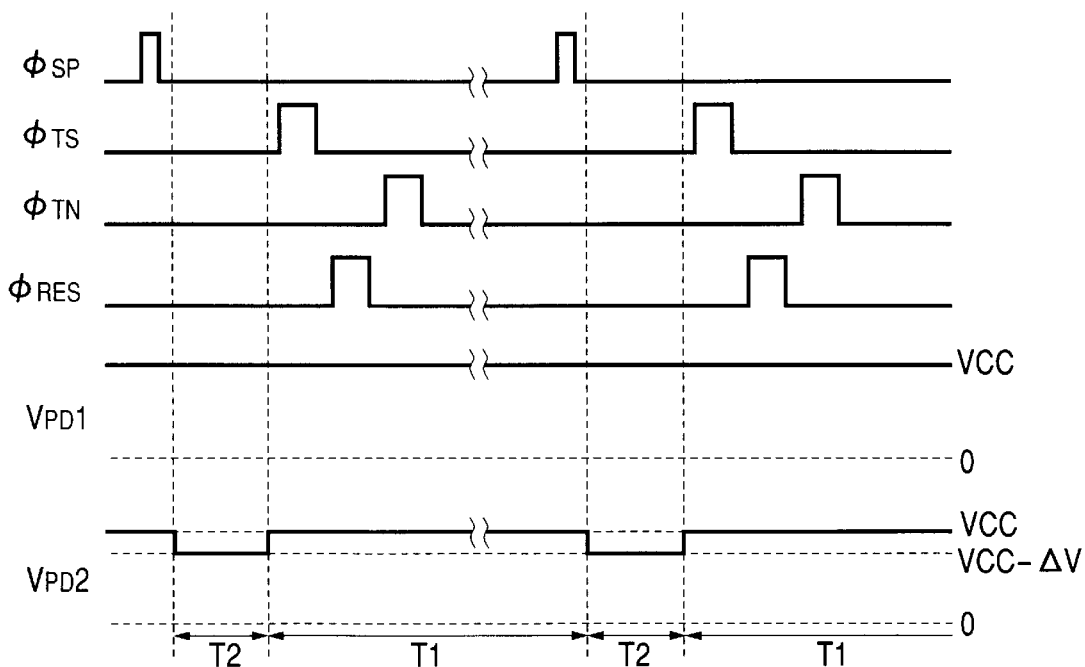
FIG. 9 is a timing chart for explaining another embodiment of the driving method of the photoelectric conversion apparatus according to the present invention.

FIG. 9 is a timing chart of driving for explaining another driving method of photoelectric conversion apparatus according to the present invention. The driving method herein is different in the transition timing of periods T1, T2 from the aforementioned driving method and is the same in the other points as the aforementioned driving method.

In the present embodiment VPD2=VCC−ΔV is applied during each period T2 between input of a start pulse SP and a start of transfer of a signal based on a light signal charge of the light-receiving element 101, through the source follower MOS 102 to the light signal retention capacitor 108 side.

Accordingly, the present embodiment can further shorten the period in which VPD2=VCC−ΔV is applied, and thus further decreases the current drain occurring during the period T2 of VPD2=VCC−ΔV.

Since in the present embodiment the voltage VPD2 applied to the cathode electrode part 19 of the light-receiving element 101 is controlled so as to cancel the potential gradient ΔV immediately before the transfer of signal to the light signal retention capacitor 108, i.e., immediately before the readout operation of signal from a state in which the photocarriers are led to the anode electrode by the potential gradient ΔV established sufficiently before the transfer of the signal based on the light signal charge of the light-receiving element 101 to the light signal retention capacitor 108 side, the afterimage can be reduced while the current drain is lowered much more.

The driving methods of the present invention detailed above are the driving methods of photoelectric conversion apparatus comprising:

a step of retaining at least a pair of electrode portions 19, 20 spaced from each other along the photoreceptive surface 14B so as to place the photoreceptive part of the second semiconductor region 11, 14 in between and connected to the first semiconductor region 13, 15, at the same potential Vcc during the first period T1; and a step of applying to the pair of electrode portions 19, 20 the voltage ΔV that can establish the potential gradient (FIGS. 6A and 6B) for moving the charge stored in the second semiconductor region 11, 14 to the readout electrode side 19B, during the second period T2.

The driving methods can reduce the afterimage while reducing the current drain more.

(Information Processing Apparatus)

In the embodiment of the present invention described above, the photoelectric conversion apparatus of the type in which the light-receiving elements 101 were arrayed on a line, was described as an example, but similar effects can also be achieved, for example, in the photoelectric conversion apparatus or solid state image sensing apparatus in which the light-receiving elements are arrayed in two dimensions.

When a contact image sensor is constructed using the photoelectric conversion apparatus according to the embodiment of the present invention and when it is mounted, for example, in an image reading system (information processing apparatus) such as a FAX machine, an image scanner, or the like, it is feasible to implement reading of image with high quality, because the afterimage characteristics are excellent even during operation at high speed.

Figure 10:
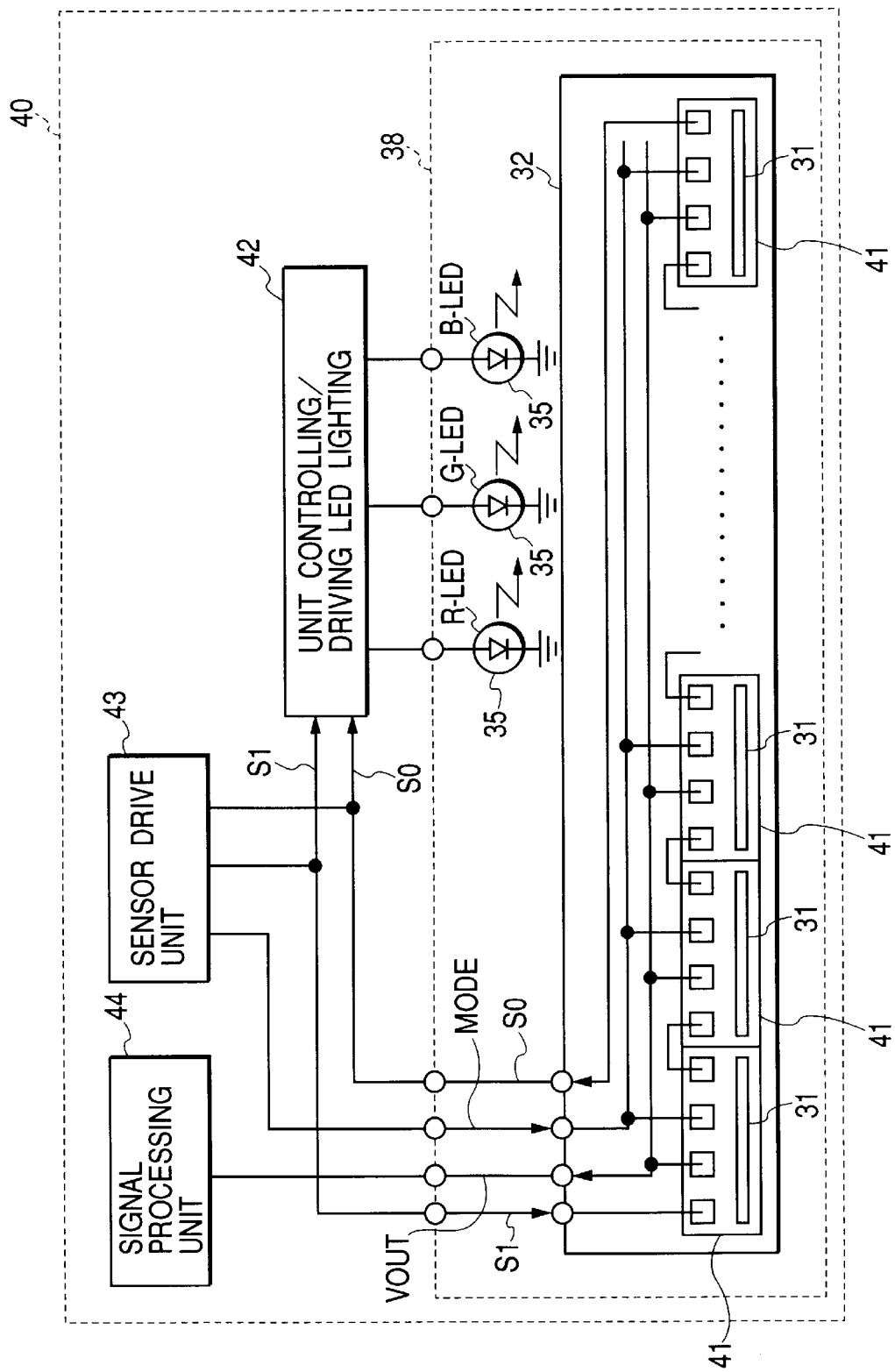
FIG. 10 is a schematic diagram showing a configuration of an information processing apparatus according to an embodiment of the present invention.
Figure 11:
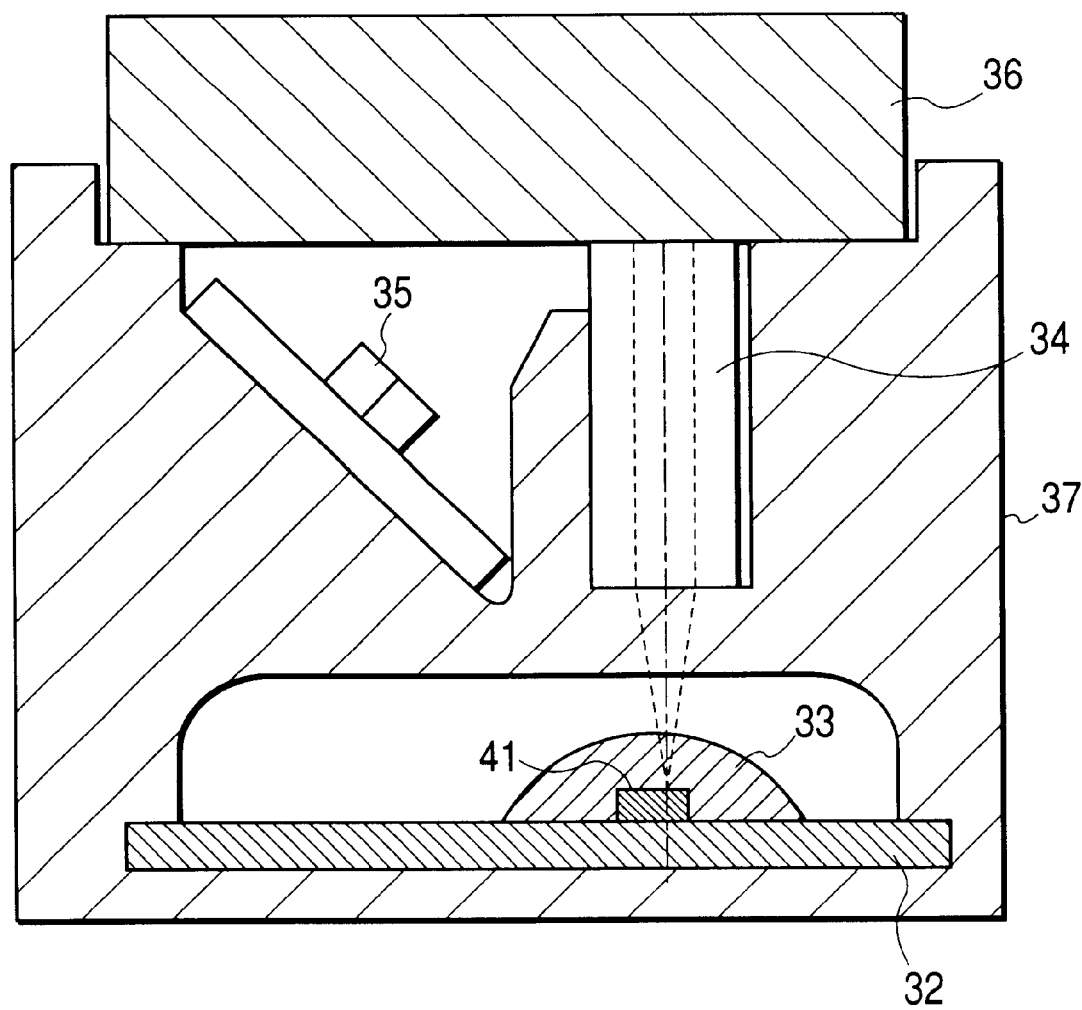
FIG. 11 is a cross-sectional view of an image sensor mounted in the photoelectric conversion apparatus of the present invention.
Figure 12:
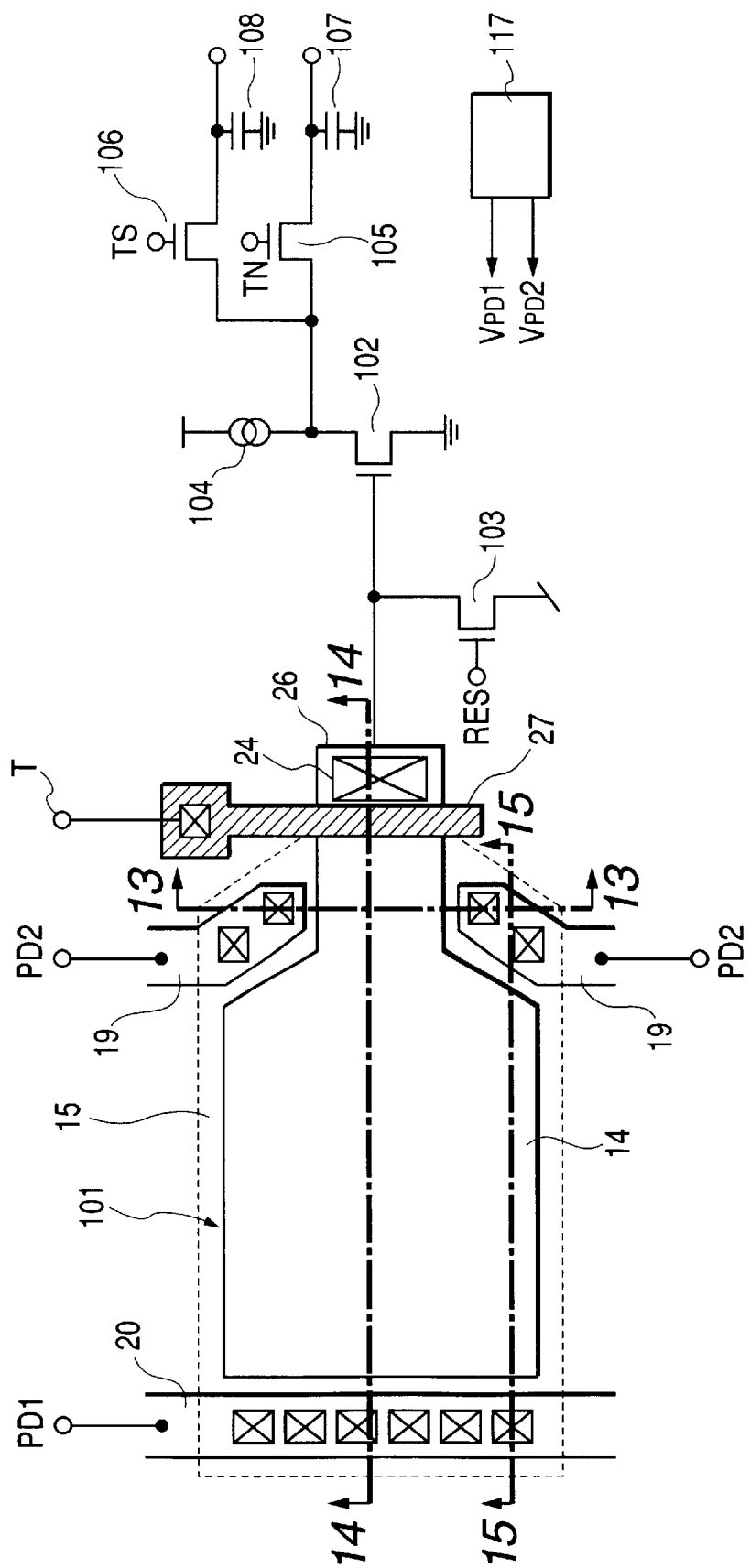
FIG. 12 is a schematic top plan view of a photoelectric conversion apparatus according to another embodiment of the present invention.
Figure 13:
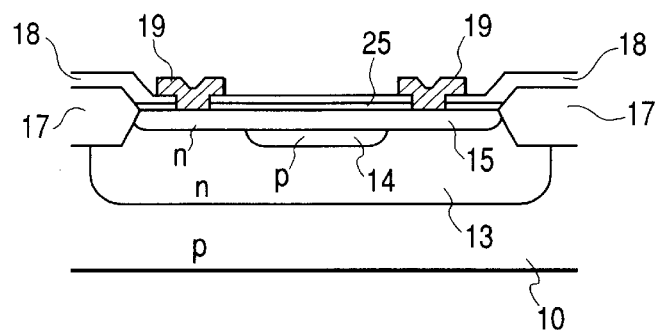
FIG. 13 is a cross-sectional view along a line 13—13 of FIG. 12.
Figure 14:
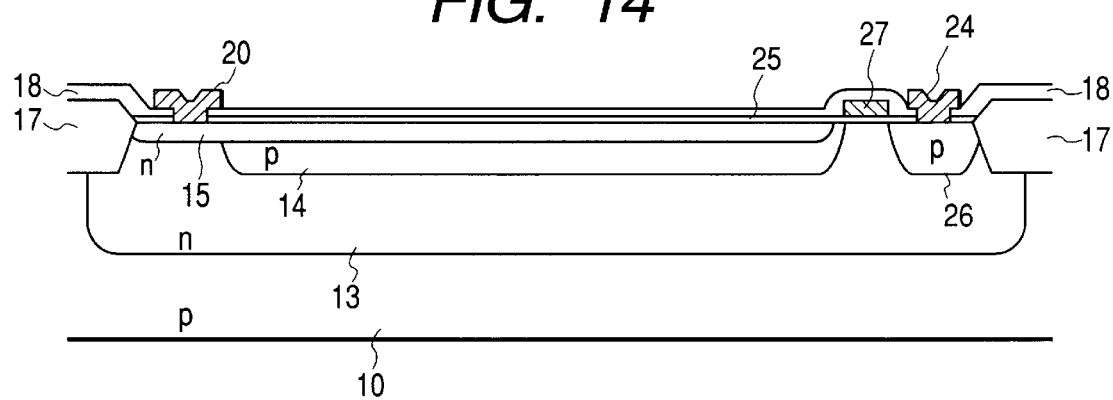
FIG. 14 is a cross-sectional view along a line 14—14 of FIG. 12.
Figure 15:
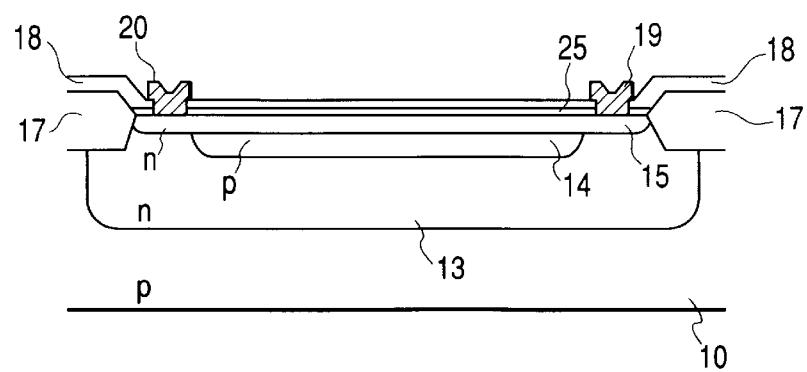
FIG. 15 is a cross-sectional view along a line 15—15 of FIG. 12.

FIG. 10 is a structural plan view of an image reading system provided with the contact image sensor constructed using the photoelectric conversion apparatus of the present invention. FIG. 11 is a cross-sectional view of the contact image sensor. The image reading system of the present embodiment will be described referring to FIGS. 10 and 11.

As shown in FIG. 10, the image reading system 40 is comprised of a contact image sensor 38, a signal processing unit 44 consisting of an electronic circuit, a sensor driving unit 43 consisting of an electronic circuit, a mount substrate 32 consisting of a ceramic material or the like, and light emitting devices 35 consisting of LEDs or the like (including an LED driving unit). Then an image sensor module is constructed by multiply mounting photoelectric conversion apparatus chips 41 comprised of LSI chips in an in-line pattern or zigzag pattern on the ceramic mount substrate 32. Each of the photoelectric conversion apparatus chips 41 is connected through bonding wires to lines on the mount substrate 32.

FIG. 10 shows I/O terminals and buses of a start signal SI to activate the shift register 113 of the leftmost photoelectric conversion apparatus chip 41 on the plane of FIG. 10, an end signal (which is a start signal of a next chip) SO outputted from the shift register 113 of the rightmost photoelectric conversion apparatus chip 41, a signal output Vout, and a resolution switching control signal MODE used according to necessity. The sensor driving unit 43 supplies the start signal SI and the resolution control signal MODE as sensor driving signals to the contact image sensor 38 to control the operation thereof.

As shown in FIG. 11, the contact image sensor is comprised of an optically transparent support 36, LED light sources 35 for radiating light of red, green, and blue toward the support 36, a lens array 34 for condensing reflected light from an original to focus it on the surface of the light-receiving elements, photoelectric conversion apparatus chips 41 on the ceramic substrate 32 for photoelectrically converting the reflected light condensed by the lens array 34, a chip coating 33 of silicone resin or the like for protection of the photoelectric conversion apparatus chips 41, and a housing 37. These are assembled into the contact image sensor.

The output signal Vout of the contact image sensor 38 is connected to the signal processing unit 44 and the signal processing unit 44 effects processing, for example, A/D conversion, shading correction, dark correction, color synthesis, etc., to generate a final image signal.

Further, the LED light sources 35 provided in the contact image sensor 38 are connected to the LED lighting control unit 42 and the LED lighting control unit 42 controls lighting timing, based on the start signal SI supplied from the sensor driving unit 43 and the chip start signal SO from the rightmost photoelectric conversion apparatus chip 41 in FIG. 10.

Accordingly, during emission of only red from the LED light sources 35, the photoelectric conversion apparatus chips 41 are driven to read the red information. Subsequently, green information and blue information is successively read in similar fashion. These color information of the original is combined by image processing whereby the color original can be read without use of a color filter.

In the present embodiment, the start signal SI sent from the unit for controlling the driving of the contact image sensor is used as a signal for controlling a lighting start of the LED light sources 35, and the end signal SO as a signal for controlling a lighting end of the LED light sources 35. Accordingly, the LED light sources 35 are substantially lit during only operating periods of all the photoelectric conversion apparatus chips 41 on the mount substrate 32.

The present embodiment was presented as an example of the color contact image sensor of the light source switching type, but, without having to be limited to the light source switching type, the present invention can also be applied to black and white contact image sensors or contact image sensors provided with a color filter.

(Embodiment 2)

A photoelectric conversion apparatus according to another embodiment of the present invention will be described with reference to FIGS. 12 to 15.

The apparatus of the present embodiment is mainly different from the photoelectric conversion apparatus shown in FIGS. 1 to 4 in that a transfer gate electrode (readout electrode) is disposed near an end of the p-type region 14 and a MOS type charge transfer element is formed adjacent to the light-receiving element.

Reference numeral 25 designates a gate insulating film and numeral 27 the foregoing transfer gate electrode. Numeral 26 denotes a floating diffusion area which is connected to the gate of the source follower MOS transistor 102 by an electrode 24 and which is made of a p-type semiconductor.

Holes generated in the photoreceptive part of the p-type region 14 of the photodiode being the light-receiving element are stored in the p-type region 14. This p-type region 14 is completely depleted in the direction of its thickness similarly as in the configuration shown in FIG. 5, and a potential gradient is created in the direction along the photoreceptive surface thereof during at least a predetermined period, as shown in FIGS. 6A and 6B.

The complete depletion and the potential gradient cause the holes to migrate to the transfer gate electrode 27 side.

When in this state a pulse to switch the transfer switch on is applied to a transfer control terminal (transfer control line) T, the holes having been stored in the part of the p-type region 14 on the transfer gate electrode 27 side are completely transferred into the floating diffusion region 26.

A signal according to the potential of the floating diffusion region 26, the electrode 24, and the gate of the MOS transistor 102 depending upon the holes thus transferred can be read out while being amplified by the MOS transistor 102.

As detailed above, the photoelectric conversion apparatus of the present embodiment is comprised of the light-receiving element 101 having the first semiconductor region 13, 15 of the first conduction type, and the second semiconductor region 14 of the second conduction type adjacent to the first semiconductor region, for storing the charge generated by photoelectric conversion; the readout electrode 27 for reading the signal based on the charge stored in the second semiconductor region; and at least a pair of electrode portions 20, 19 spaced from each other along the photoreceptive surface so as to place the photoreceptive portion of the second semiconductor region in between, and connected to the first semiconductor region.

Further, the voltage applied between electrode portions 19, 20 is ΔV that completely depletes the photoreceptive part of the second semiconductor region (FIG. 5) and that can create the potential gradient (FIGS. 6A and 6B) for moving the charge stored in the second semiconductor region, to the readout electrode side 19B.

This structure allows the apparatus to suppress the afterimage.

(Driving Method 3 of the Photoelectric Conversion Apparatus)

Figure 16:
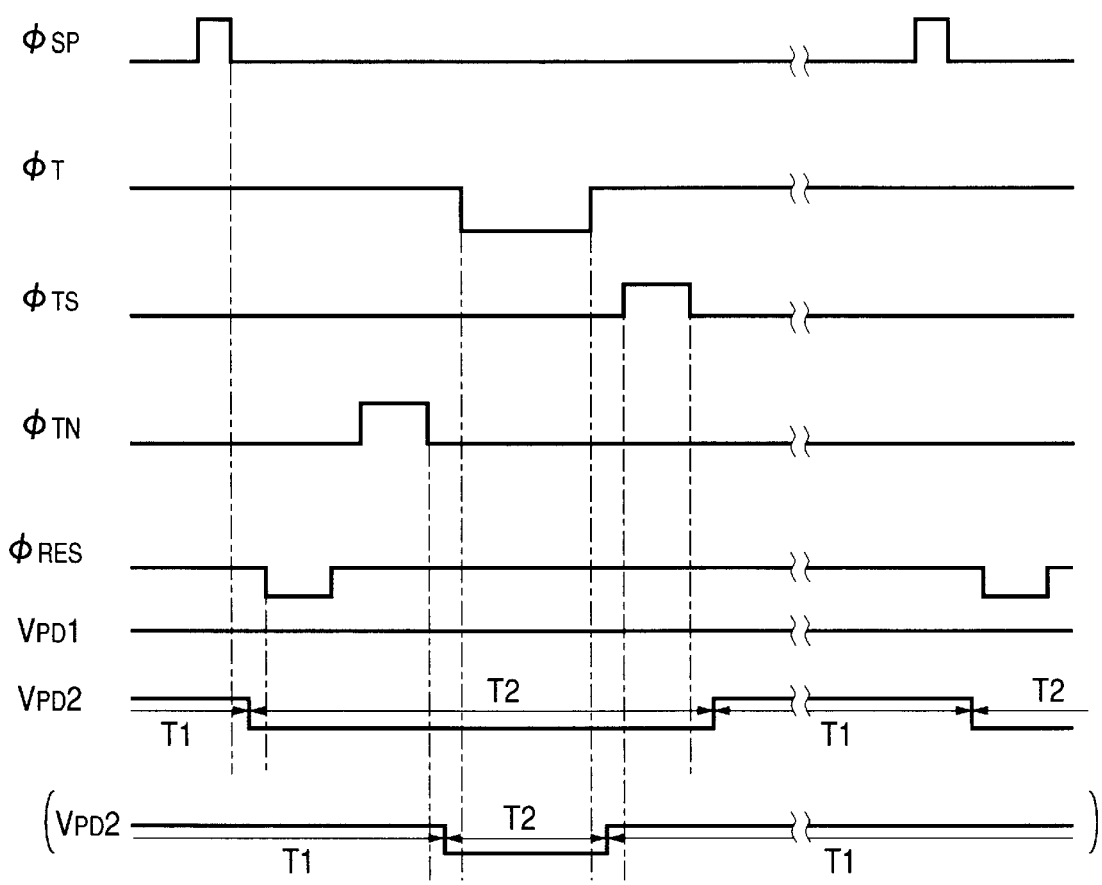
FIG. 16 is a timing chart for explaining another embodiment of the driving method of the photoelectric conversion apparatus according to the present invention.

FIG. 16 is a timing chart for explaining still another embodiment of the driving method of the photoelectric conversion apparatus according to the present invention.

For example, prepared is the photoelectric conversion apparatus having the transfer gate electrode as a readout electrode, as shown in FIGS. 12 to 15.

After completion of desired storage in the light-receiving element 101 of the photoelectric conversion apparatus, a start pulse φSP of the high level is fed and then the voltage VPD2 applied to the electrode portion 19 is switched from VCC to VCC−ΔV.

When the reset pulse φRES supplied to the reset control line RES then turns to the low level, it is applied to the gate of the reset MOS 103 consisting of a pMOS transistor to turn the reset MOS 103 on to reset the potential of the floating diffusion region 26 to a reset potential.

When the pulse signal φTN supplied to the control line TN turns to the high level to be applied to the gate of the MOS switch 105 to turn the MOS switch 105 on, a noise signal, after converted to a voltage in the MOS source follower 102, is transferred to the light signal retention capacitor 107 and retained there.

When the transfer control pulse φT supplied to the transfer gate control line T turns to the low level thereafter, it is applied to the gate of the transfer MOS switch (14, 27, 26) to switch the transfer MOS switch on to transfer the charge of all the holes, having been stored in the p-type region 14 of the light-receiving element 101 and having migrated to the side near the transfer gate electrode 27 (near the p-type region 14 between the split electrode portions 19) by the potential gradient of the potential difference ΔV, to the floating diffusion region 26.

When the pulse signal φTS supplied to the control line TS then turns to the high level to be applied to the MOS switch 106 to turn the MOS switch 106 on, a signal based on the photo-generated holes stored in the light-receiving element 101, after converted to a voltage in the MOS source follower 102, is transferred to the light signal retention capacitor 108 and retained there.

Here the power-supply voltage VCC is applied through the power line PD1 to the first electrode part 20 in the light-receiving element 101, regardless of presence or absence of input of the start pulse SP of the high level, to fix the first electrode part 20 at a predetermined potential. The power-supply voltage VCC is applied through the power line PD2 to the second electrode part 19 during each principal period T1 in which a charge is stored in the light-receiving element 101. During each period T2 including operations of reset, readout transfer of a noise signal, transfer of a charge to the floating diffusion region 26, and readout transfer of a light signal, except for the periods T1, the voltage (VCC−ΔV) is applied through the power line PD2 to the second electrode part 19, so that the potential of the second electrode part 19 becomes lower by ΔV than that of the first electrode part 20.

Accordingly, in the period T1 the photocarriers in the light-receiving element 101 do not reach the transfer gate electrode 27 side, as in the case shown in FIG. 6A, but in the period T2, the potential gradient is established in the direction along the photoreceptive surface toward the transfer gate electrode 27 side, as in the case shown in FIG. 6B, so that the photocarriers in the light-receiving element 101 can be led to the transfer gate electrode 27 side.

After that, the potential gradient is eliminated to reduce power consumption. The period T1 is a time sufficiently longer than the period T2.

The transition timing into the period T2 can also be controlled, as indicated by the timing in parentheses of FIG. 16, so that the potential gradient of the potential difference ΔV is created between the first electrode portion 20 and the second electrode portion 19 during only a period embracing only the transfer period by the transfer gate electrode 27 (the period of the low level of the pulse φT) on a time series basis. A time sufficient for the period T2 is, for example, 3 μsec or more.

The driving method of the present invention as detailed above is the method of driving the photoelectric conversion apparatus, comprising:

the step of retaining at least a pair of electrode portions 19, 20 spaced from each other along the photoreceptive surface so as to place the photoreceptive portion of the second semiconductor region 14 in between, and connected to the first semiconductor region 13, 15, at the same potential Vcc during the first period T1; and the step of applying between electrode portions 19, 20 the voltage ΔV that can create the potential gradient (FIGS. 6A and 6B) for moving the charge stored in the second semiconductor region 11, 14, to the readout electrode 27 side, during the second period T2.

This driving method can reduce the afterimage while reducing the current drain more.

(Embodiment 3)

A photoelectric conversion apparatus according to still another embodiment of the present invention will be described with reference to FIG. 17.

Figure 17:
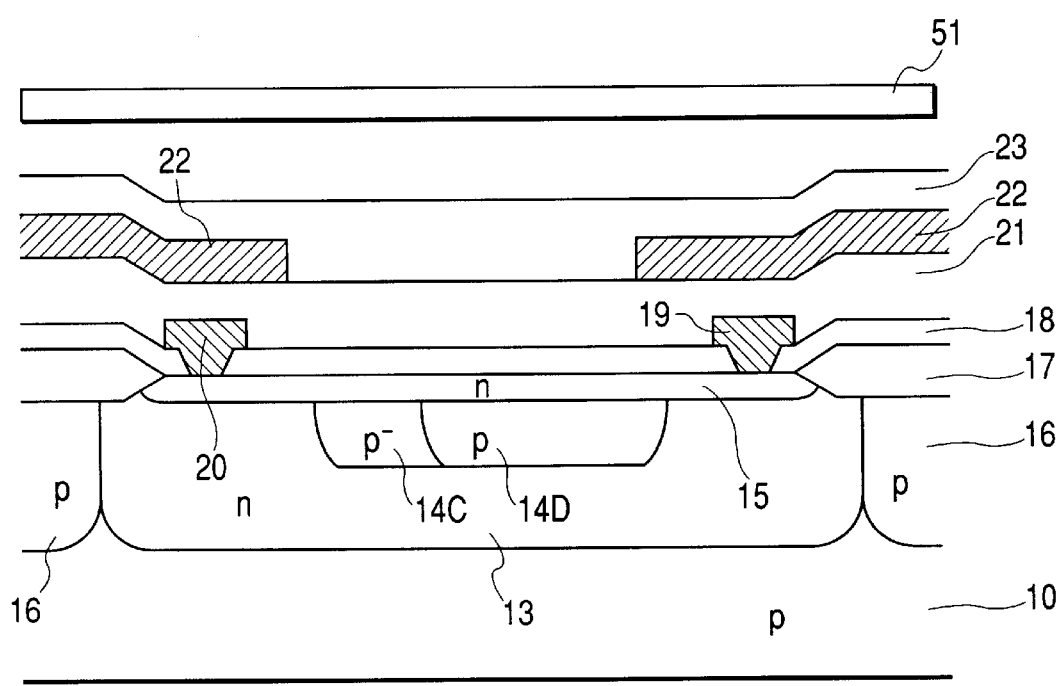
FIG. 17 is a schematic cross-sectional view of a photoelectric conversion apparatus according to still another embodiment of the present invention.
Figure 18A:
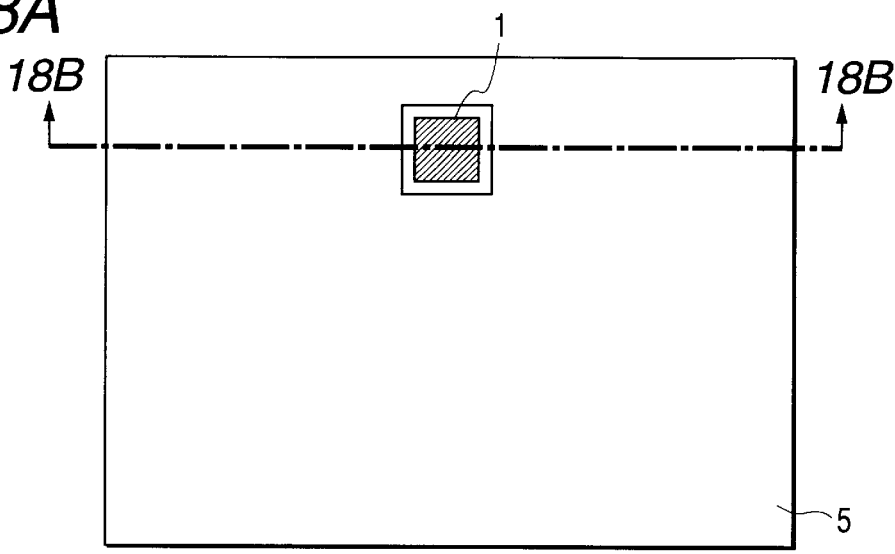
FIG. 18A is a schematic top plan view of the light-receiving element in the conventional photoelectric conversion apparatus.
Figure 18B:
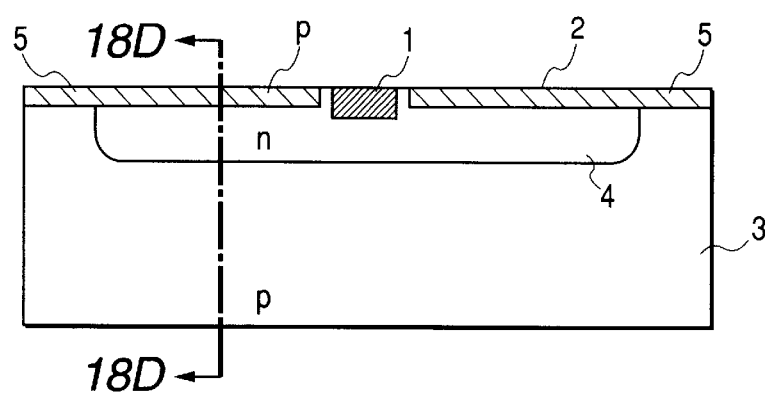
FIG. 18B is a cross-sectional view along a line 18B—18B of FIG. 18A.
Figure 18C:
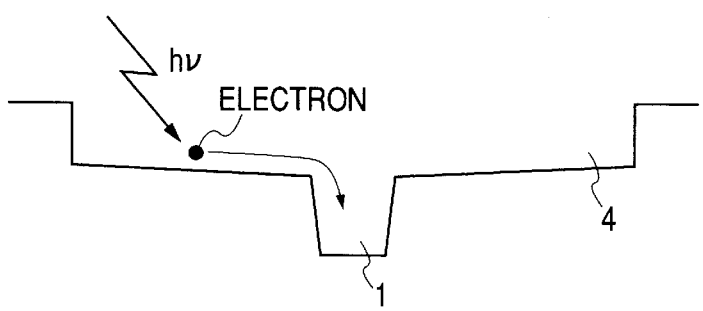
FIG. 18C is a diagram showing a potential profile in the direction along a line 18B—18B of FIG. 18A.
Figure 18D:
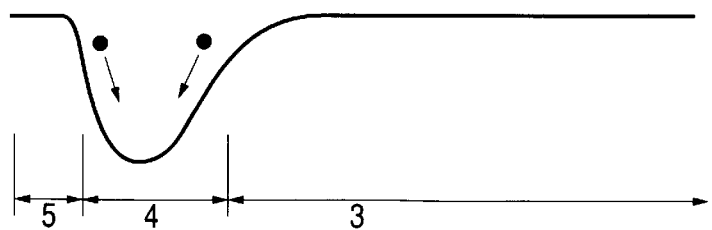
FIG. 18D is a diagram showing a potential profile in the direction along a line 18D—18D of FIG. 18B.

The photoelectric conversion apparatus shown in FIG. 17 is mainly different from the photoelectric conversion apparatus shown in FIG. 3 in that regions 14C, 14D of different impurity concentrations exist in the p-type region 14 and an internal electric field creates a potential profile that makes it much easier for holes to migrate to the readout electrode side. This is an effective configuration as long as there are no strict restrictions on the number of exposures (the number of masks) in photolithography in terms of production cost.

The other structure and operation are the same as in each of the embodiments described above.

It is also preferable to employ the following configurations according to needs.

Describing the configuration of FIG. 17 as an example, reference numeral 51 designates a converter provided according to needs, which is a so-called wavelength conversion element that emits visible light or the like upon reception of radiations such as X-rays, α rays, or γ rays. The converter is preferably a material called a scintillator or a phosphor such as cesium iodide (CsI) or the like. In combination with such a material, it is also preferable to place an optical plate consisting of a material (e.g., lead glass) for guiding the visible light emitted from the converter to the photoreceptive surface and for intercepting radiations having been transmitted by the converter, between the converter and the photoreceptive surface of the photoelectric conversion apparatus.

When this converter 51 is placed integrally or as a separate body on the photoreceptive surface of the photoelectric conversion apparatus of the present invention, the apparatus can function as an image sensing apparatus of radiographic image, and it can be preferably applied to medical and nondestructive inspections.

In each of the embodiments described above, the conduction types of the transistors may also be reversed by altering the p-type portions to the n-type portions while altering the n-type portions to the p-type portions. In this case the relative potential magnitude relation also becomes reverse.

In the present invention, as described above, the voltage is applied to the photoelectric conversion means with the charge being retained therein to move the charge retained in the photoelectric conversion means, to the wire side and in that state the charge or the like is transferred through the wire to the outside, so that there remains no charge in the photoelectric conversion means after the transfer, which can improve the afterimage characteristics of the photoelectric conversion apparatus.

What is claimed is:

1. A photoelectric conversion apparatus comprising:
    a light-receiving element having a first semiconductor region of a first conduction type, and a second semiconductor region of a second conduction type for storing a charge generated by photoelectric conversion adjacent to said first semiconductor region;
    a readout electrode being used for reading a signal based on the charge stored in said second semiconductor region; and
    at least a pair of electrode portions spaced from each other along a surface including a photoreceptive surface, and connected to said first semiconductor region,
    wherein a voltage that completely depletes a photoreceptive portion of said second semiconductor region and that creates a potential gradient for moving the charge stored in said photoreceptive portion of said second semiconductor region, to the said readout electrode, is applied between said pair of electrode portions.

2. The photoelectric conversion apparatus according to claim 1, wherein said first semiconductor region has a semiconductor layer formed so as to be placed between said second semiconductor region and an insulating layer placed above said second semiconductor region and each of said pair of electrode portions is in contact with said semiconductor layer.

3. The photoelectric conversion apparatus according to claim 2, wherein said semiconductor layer covers the photoreceptive surface of said second semiconductor region.

4. The photoelectric conversion apparatus according to claim 2, wherein said second semiconductor region located below said semiconductor layer is completely depleted by depletion layers extending from pn junctions on the upper and lower sides of the second semiconductor region.

5. The photoelectric conversion apparatus according to claim 1, wherein said pair of electrode portions are shielded by a light shield layer.

6. The photoelectric conversion apparatus according to claim 1, wherein an electrode portion placed on the said readout electrode side out of said pair of electrode portions is placed in such a split form as to sandwich said readout electrode along the photoreceptive surface.

7. The photoelectric conversion apparatus according to claim 1, wherein said readout electrode is a transfer gate electrode for transferring a charge to a floating diffusion region.

8. The photoelectric conversion apparatus according to claim 1, wherein said readout electrode is an anode electrode or a cathode electrode connected to a gate of an amplifying transistor.

9. The photoelectric conversion apparatus according to claim 1, wherein, immediately before or during a transfer operation to transfer the charge stored in said second semiconductor region or a readout operation to read the signal based on said charge, the voltage that can create said potential gradient is applied for a predetermined period.

10. The photoelectric conversion apparatus according to claim 1 or 9, wherein, during most of an operation period of said photoelectric conversion apparatus, said pair of electrode portions are retained each at an equal potential.

11. The photoelectric conversion apparatus according to claim 1, wherein the voltage applied to said first semiconductor region is a reverse bias voltage to said second semiconductor region.

12. An information processing apparatus comprising:
    the photoelectric conversion apparatus as set forth in claim 1;
    a driving circuit for driving said photoelectric conversion apparatus; and
    a signal processing circuit for processing a signal outputted from said photoelectric conversion apparatus.

13. An information processing apparatus comprising:
    the photoelectric conversion apparatus as set forth in claim 1;
    a driving circuit for driving said photoelectric conversion apparatus;
    a signal processing circuit for processing a signal outputted from said photoelectric conversion apparatus; and
    a converter for converting a radiographic image into a visible light image.

14. A photoelectric conversion apparatus comprising:
    a light-receiving element having a first semiconductor region of a first conduction type, and a second semiconductor region of a second conduction type for storing a charge generated by photoelectric conversion adjacent to said first semiconductor region;
    a readout electrode being used for reading a signal based on the charge stored in said second semiconductor region;
    at least a pair of electrode portions spaced from each other along a surface including a photoreceptive surface, and connected to said first semiconductor region; and
    a circuit for retaining said pair of electrode portions at an equal potential during a first period and for applying between said pair of electrode portions a voltage that creates a potential gradient for moving the charge stored in a photoreceptive portion of said second semiconductor region, to the said readout electrode, during a second period.

15. The photoelectric conversion apparatus according to claim 14, wherein said second period is a period immediately before or during a transfer operation to transfer the charge stored in said second semiconductor region or a readout operation to read the signal based on said charge, through said readout electrode.

16. The photoelectric conversion apparatus according to claim 14 or 15, wherein said first period is longer than said second period.

17. A method of driving a photoelectric conversion apparatus comprising a light-receiving element having a first semiconductor region of a first conduction type, and a second semiconductor region of a second conduction type for storing a charge generated by photoelectric conversion adjacent to said first semiconductor region, and a readout electrode being used for reading a signal based on the charge stored in said second semiconductor region, said method comprising:
    a step of retaining at least a pair of electrode portions spaced from each other along a surface including a photoreceptive surface, and connected to said first semiconductor region, at an equal potential during a first period; and
    a step of applying between said pair of electrode portions a voltage that creates a potential gradient for moving the charge stored in a photoreceptive portion of said second semiconductor region, to the said readout electrode, during a second period.

* * * * *

UNITED STATES PATENT AND TRADEMARK OFFICE
CERTIFICATE OF CORRECTION

PATENT NO. : 6,608,299 B2
DATED : August 19, 2003
INVENTOR(S) : Hiraku Kozuka

It is certified that error appears in the above-identified patent and that said Letters Patent is hereby corrected as shown below:

Column 2,
Line 16, "the both" should read -- both --.

Column 6,
Line 2, "p+type" should read -- $p^+$ type --.

Column 8,
Line 11, "convenience" should read -- convenience's --.

Column 9,
Line 9, "after" should read -- after being --.

Column 11,
Line 67, "These" should read -- This --.

Column 13,
Line 42, "after" should read -- after being --.

Signed and Sealed this

Sixteenth Day of March, 2004

JON W. DUDAS
*Acting Director of the United States Patent and Trademark Office*